United States Patent [19]

Barbu

[11] Patent Number: 4,703,284
[45] Date of Patent: Oct. 27, 1987

[54] HIGH-FREQUENCY AMPLIFIER

[75] Inventor: Stefan Barbu, Caen, France

[73] Assignee: U.S. Philips Corporation, New York, N.Y.

[21] Appl. No.: 861,036

[22] Filed: May 8, 1986

[30] Foreign Application Priority Data

May 10, 1985 [FR] France ................. 85 07123

[51] Int. Cl.$^4$ ............................................. H03F 3/45
[52] U.S. Cl. .................................. 330/259; 330/260; 330/261; 307/555; 307/567
[58] Field of Search ............... 330/252, 259, 260, 261, 330/310; 307/540, 555, 557, 567; 455/210, 308, 309

[56] References Cited

U.S. PATENT DOCUMENTS 3,660,773  5/1972  Free ................................ 330/261 X
4,418,321  11/1983  Böhme ............................. 330/252
4,547,744  10/1985  Kasperkovitz ................. 330/252 X Primary Examiner—James B. Mullins
Attorney, Agent, or Firm—Thomas A. Briody; William J. Streeter; Marianne R. Rich

[57] ABSTRACT

The invention relates to a high-frequency amplifier which comprises only two cascaded differential stages. The collectors of the transistors ($T_1$, $T_2$) of the differential input stage are connected to the emitters of two transistors ($T_3$, $T_4$) which have feedback between their collectors and bases and which are biased by means of resistors ($R_1$, $R_2$). This input stage forms a resonant circuit. The differential output stage comprises transistors ($T_6$ and $T_7$) whose emitters are interconnected by a phase-lead capacitor ($C_1$) and two resistors ($R_8$, $R_9$). Such an arrangement enables a high gain to be obtained over the entire operating frequency range of the amplifier and in particular for high frequencies.

5 Claims, 5 Drawing Figures

HIGH-FREQUENCY AMPLIFIER

BACKGROUND OF THE INVENTION

The invention relates to a high-frequency amplifier comprising at least one differential stage which comprises a first transistor and a second transistor. The emitters, are coupled to each other, and to a first current source, whose bases receive the input signals. The collectors are connected to the emitters of a third transistor and a fourth transistor respectively, whose collectors are each connected to a supply-voltage source by a first bias resistor and a second bias resistor respectively. The bases of the third and the fourth transistor are connected to the collectors of the fourth and the third transistor respectively.

An amplifier of the type defined in the opening paragraph is known from German Patent Application No. DE 3,121,314 (PHILIPS GLOEILAMPENFABRIEKEN) published on Apr. 22, 1982. The patent application describes a high-frequency amplifier which is specifically suitable for powering a frequency divider and in which the bases of the third and the fourth transistor are connected to the collectors of the fourth and the third transistor respectively via base resistors. The base resistor's value as well as the value of the collector resistors and that of the bias current are selected in conformity with formulas given on page 6 lines 5 to 31 so as to optimise the high-frequency behaviour and at the same time also eliminate the d.c. component in the ideal case (page 6, lines 15 to 19).

Multi-stage high-frequency amplifiers are known which are in particular suitable for use as input amplifiers for a frequency divider and which have a high gain of the order of, for example 20 to 30 in the central part of their operating-frequency range. However, these amplifiers have a pass band which is limited towards the higher frequencies where the response curve exhibits a comparatively strong roll-off ($-18$ to $24$ dB/octave). Indeed, with such amplifiers it is difficult to obtain a gain higher than unity at the maximum operating frequency of the amplifier if this frequency, which is for example of the GHz order, substantially approaches the intrinsic cut-off frequency of the transistors being used, for example when it reaches a fifth or a third of said cut-off frequency. At these frequencies the transistors produce very annoying additional attenuations. By means of a single-stage amplifier it is possible to obtain a broad pass band, but the gain in the central part of the pass band is then limited to a value of the order of, for example, 4 to 5.

On the other hand, if two stages of the same type are cascaded the amplifier thus obtained will have a gain smaller than unity at a frequency lower than the frequency for which one stage alone has a gain equal to unity. This is because the input impedance of the stage forming the output stage of the amplifier gives rise to an additional attenuation of the input stage, which attenuation adds to said attenuation caused by the transistors. In other words, because it is coupled to the output stage, the input stage has a pass band which is limited towards the high frequencies, and any coupling is found to be problematic.

SUMMARY OF THE INVENTION

It is the object of the invention to mitigate these problems and to provide a wide-band amplifier having a high gain at high frequencies and comprising two cascaded differential stages, namely an input staage and an output stage, which amplifier nevertheless has a gain higher than unity for a maximum operating frequency of the amplifier which may be substantially higher than 1 GHz, for example 1.8 GHz, and which approaches substantially the intrinsic cut-off frequency of the transistors used, for example 6 GHz, while maintaining the gain at frequencies situated in the central part of its operating frequency range high.

To basic idea of the invention, that to each of the two stages, each having a gain higher than or equal to unity in the operating frequency range of the amplifier, the following functions are assigned.

The input stage is a resonance amplifier which is capable of amplifying small signals and which has a substantial gain at frequencies in the central part of its operating frequency range and a substantially higher maximum gain at frequencies situated in the upper part of its operating frequency range. The higher maximum gain enables an overall gain of at least unity at high frequencies to be obtained despite the strong roll-off as a result of the coupling to the output stage.

The output stage is an amplifier of the phase-lead type which can handle strong signals, which can provide a substantial gain at frequencies situated in the central part of the operating frequency range and which has a smaller roll-off of approximately $-6$ dB/octave at high frequencies. An amplifier of the phase-lead type is described in U.S. Pat. No. 3,660,773 (FIG. 1). In said amplifier the phase lead is obtained by a capacitor connected across the emitter feedback resistors of a differential stage in order to reduce the feedback effect at high frequencies.

To this end, the stages of the amplifier in accordance with the invention are constructed as follows.

The input stage is constituted by a differential stage of the aforementioned type in which the bases of the third transistor and the fourth transistor are connected directly to the collectors of the fourth transistor and the third transistor respectively.

The output stage comprises a fifth transistor and a sixth transistor which have their bases connected to the collectors of the first transistor and the second transistor, respectively, which each have their collectors connected to said supply-voltage source by a third and a fourth bias resistor, respectively. The fifth and sixth transistors have their emitters interconnected by a first capacitor in parallel with a first resistive divider bridge whose center is connected to a second current source.

The elements of the first resistive divider bridge, the first capacitor and the bias resistors are selected in such a way that the overall gain of the amplifier is higher than unity in its operating frequency range.

In one embodiment of the invention, the collectors of the fifth and sixth transistor are each connected to the bse of an output transistor arranged as an emitter follower.

In order to limit the gain for the d.c. component of the input signals, the amplifier in accordance with the invention may comprise a second resistive divider bridge which is arranged between the collector of the fifth transistor and earth and which has its center, which is decoupled by means of a second capacitor, connected to the base of the first transistor via a first input resistor. A third resistive divider bridge, arranged between the collector of the sixth transistor and earth having its center, which is decoupled by means of a third capacitor, connected to the base of the second transistor via a second input resistor.

It is to be noted that the output stage may be operated in the saturated mode and thus produce clipped output signals in response to sinusoidal input signals, so that it performs a shaping function, renders it particularly suitable as an input amplifier for a frequency divider.

BRIEF DESCRIPTION OF THE FIGURES

An embodiment of the invention will now be described in more detail, by way of example with reference to the accompanying drawings in which.

DESCRIPTION OF THE PREFERRED EMBODIMENT

Figure 1:
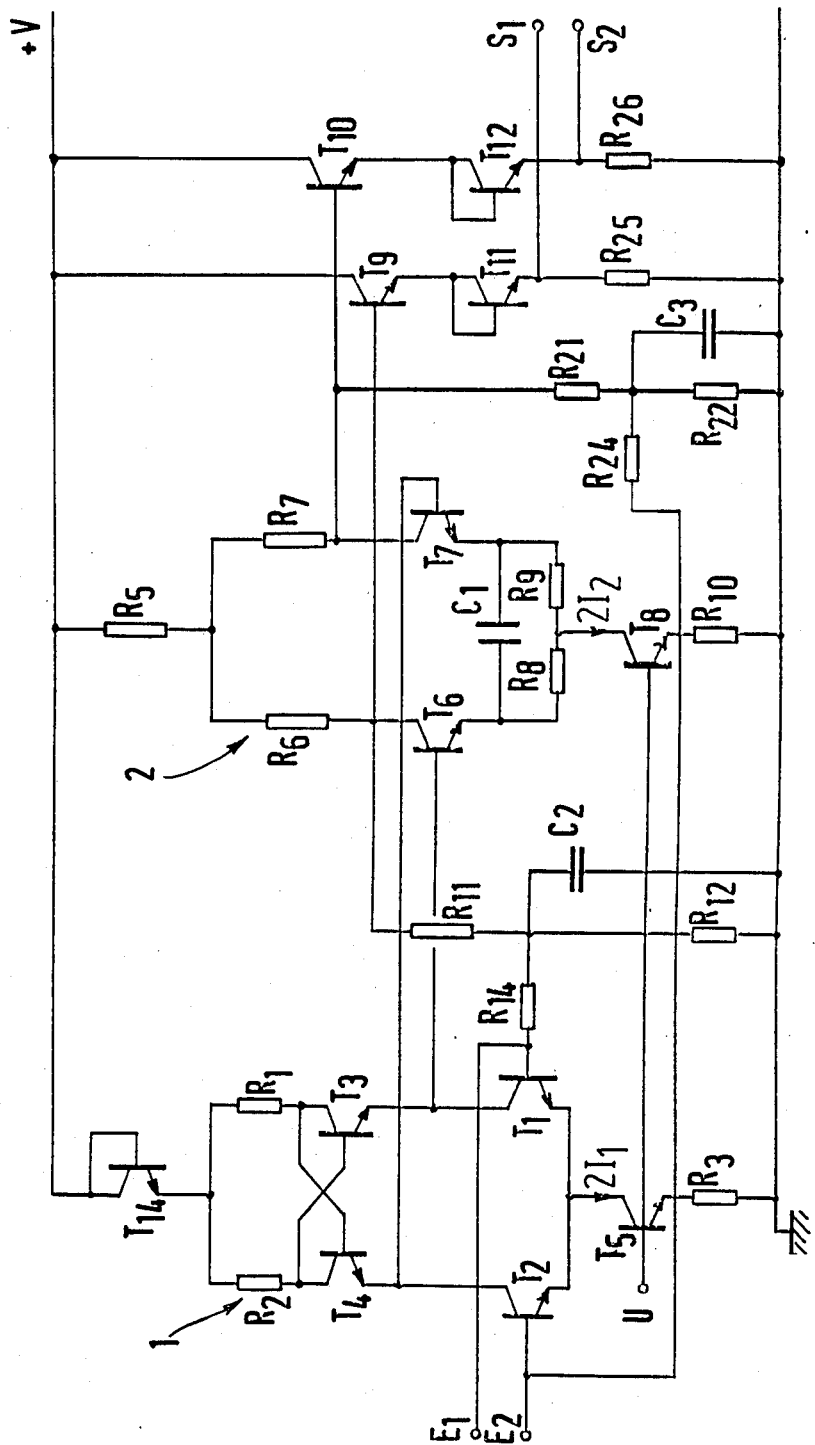
FIG. 1 is a circuit diagram of the amplifier in accordance with the invention.

As is shown in FIG. 1, the input stage of the amplifier comprises a differential stage with two emitter-coupled transistors $T_1$ and $T_2$, which are connected to a current source constituted by a transistor $T_5$ whose emitter is connected to earth by resistor $R_3$, a control voltage U, which determines the current $2I_1$ supplied by the current source, being applied to the base of the transistor $T_5$.

The inputs $E_1$ and $E_2$ of the amplifier are formed by the bases of the transistors $T_3$ and $T_4$ respectively. Two transitors $T_3$ and $T_4$ which form the resonant circuit of the input stage have their emitters connected to the collectors of the transistors $T_1$ and $T_2$ respectively, the base of transistor $T_3$ being connected to the collector of the transistor $T_4$ and vice versa. The collectors of the transistors $T_3$ and $T_4$ are connected to a supply-voltage source via bias resistors $R_1$ and $R_2$ respectively of the same value. This voltage source is represented as a power supply +V whose potential is reduced by one base-emitter voltage (approximately 0.8 V) by means of a diode-connected transistor $T_{14}$ whose collector and base are connected to the power supply +V and whose emitter is connected to the junction point of the resistors $R_1$ and $R_2$.

The output stage is a differential stage comprising two transistors $T_6$ and $T_7$ whose emitters are interconnected by a capacitor $C_1$ arranged in parallel with a resistor bridge ($R_8$, $R_9$) whose centre is connected to a current source constituted by a transistor $T_8$ whose emitter is connected to earth by a resistor $R_{10}$, the base of the transistor $T_8$ receiving the control voltage U which determines the current $2I_2$ supplied by the current source. The resistors $R_8$ and $R_9$ and the capacitor $C_1$ form a phase-lead circuit by means of which the gain of the output stage in the upper part of the operating frequency range can be improved.

The output signals of the input stage are applied from the collectors of the transistors $T_1$ and $T_2$ to the bases of the transistors $T_6$ and $T_7$ respectively. The collectors of the transistors $T_6$ and $T_7$ are connected to a supply voltage via resistors $R_6$ and $R_7$ respectively. This voltage source takes the form of a power supply V whose voltage is reduced by a resistor $R_5$ arranged in series between this power supply V and the junction point of the resistors $R_6$ and $R_7$, so that the current $2I_2$ always flows through the resistor $R_5$.

The collectors of the transistors $T_6$ and $T_7$ form the outputs of the output stage which may be used directly. The transistors $T_9$ and $T_{10}$ are shown as emitter followers whose collectors are connected to the power supply V, whose bases are connected to the collectors of the transistor $T_6$ and $T_7$ respectively, and whose emitters are connected to the diode-connected transistors $T_{11}$ and $T_{12}$ which are poled in the forward direction, resulting in a total shift by two base-emitter voltages (approximately 1.6 V). For this purpose the collectors of the transistors $T_{11}$ and $T_{12}$ are shortcircuited to their bases and connected to the emitters of the transistors $T_9$ and $T_{10}$ respectively. The emitters of the transistors $T_{11}$ and $T_{12}$, which are connected to earth by resistors $R_{25}$ and $R_{26}$ respectively, constitute the respective outputs $S_1$ and $S_2$ of the amplifier.

Figure 2:
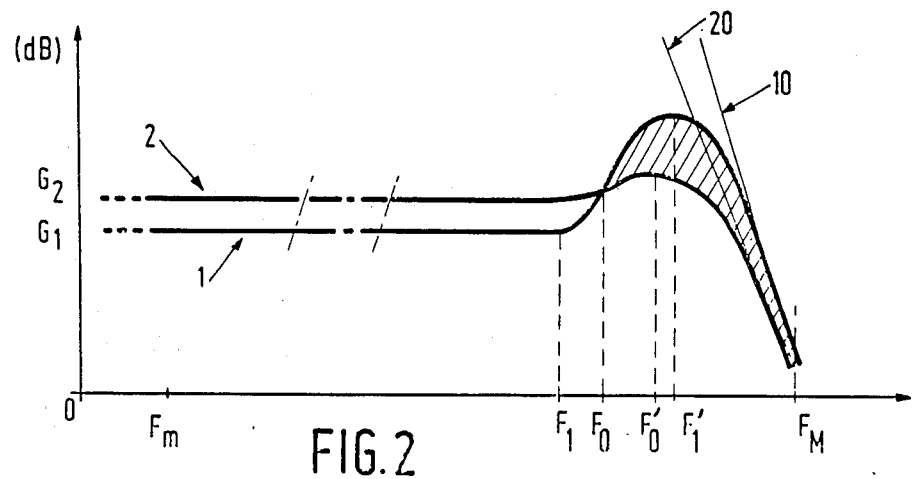
FIG. 2 shows the reponse curves of each of the two stages for the operating-frequency band of the amplifier.

FIG. 2 shows the frequency response curves of the input stage coupled to the output stage and of the output stage in the operating frequency band of the amplifier between a minimum frequency $F_m$ and a maximum frequency $F_M$.

The response curve of the input stage 1 when coupled to the output stage exhibits a substantially constant gain $G_1$ in the lower part of the frequency range of the amplifier. Under the influence of the resonant circuit the gain increases substantially from a frequency $F_1$ up to an anti-resonant frequency $F'_1$ corresponding to a maximum gain, above which the gain decreases again to approach an asymptote 10 with a slope of −12 dB/octave, the gain remaining higher than or equal to unity (0 dB) at the maximum frequency $F_M$.

The response curve of the output stage 2 has a substantially constant gain $G_2$ which may be about equal to $G_1$ in the lower part of the frequency range of the amplifier. Under the influence of the phase-lead circuit the gain increases slightly from a frequency $F_0$ up to a frequency $F'_0$, above which the gain decreases again to approach an asymptote 20 having a slope of −6 dB/octave, the gain then remaining higher than or equal to unit (0 dB) at the selected maximum frequency $F_M$.

In the lower part of the operating frequency range of the amplifier the two stages have substantially equal gain factors ($G_1 \sim G_2$) up to a frequency $F_1$ above which the gain of the input stage begins to increase substantially as a result of said resonant circuit (hatched area). As the asymptote 10 of the curve 1 has a stronger slope than the asymptote 20 of the curve 2, there is a cross-over frequency which may be lower or suitably higher than $F_M$.

Hereinafter, it will be explained how the circuit parameters are suitably selected in order to obtain the above-mentioned frequency response curves. For this purpose, by way of illustration, an example is taken where $F_m \simeq 40$ MHz and $F_M = 1$ GHz, pertaining to an input amplifier intended for a frequency divider suitable for use in a television receiver operating in said frequency band.

According to the Applicant the response curve $G_1(s)$ of the input stage alone, i.e. when not coupled to the output stage, may be approximated to by the following formula:

$$G_1(s) = \frac{G_1(1 - sT_1)}{(1 + sT_2)(1 + sT_3)}$$

-continued where $G_1 = \dfrac{R_1 I_1}{V_T}$ $T_1 = C_{BC}[4R_1 + R_b(1 + G_1)] = \dfrac{1}{2\pi F_1}$ $T_2 = C_{BC}(R_b + 4R_1) = \dfrac{1}{2\pi F_2}$ $T_3 = K\, C_{BE} \dfrac{V_T}{I_1} = \dfrac{1}{2\pi F_3}$ where $K=4$ and $V_T=26$ mV.

$C_{BC}$ and $C_{BE}$ are the base-collector and base-emitter capacitances of the transistors $T_3$ and $T_4$ respectively and $R_b$ is the intrinsic base resistance of these transistors.

The relation $T_1 > T_2$ is always valid. The relation $T_2 > T_3$ is also satisfied because $C_{BE} \sim 2 C_{BC}$ for integrated transistors and the term $V_T/I_1$ is small ($I_1 \sim 1$ mA) relative to $R_b + 4R_1$, so that:

$F_1 < F_2 < F_3$.

The curve 1 in FIG. 2 is therefore characteristic of the circuit arrangement of the input stage.

For more information on the design of transistors for very high frequencies reference is made to the book "Analysis and Design of Analog Integrated Circuits" by P. R. Gray and R. G. Meyer (published by John Wiley and Sons USA-1977).

With a transistor of a type having an intrinsic cut-off frequency $f_T$ of the order 5 GHz the following values are obtained when $R_1 = 100\,\Omega$ and $I_1 = 1$ mA and consequently $G_1 \approx 4$:

$F_1 \approx 300$ MHz, $F_2 \approx 540$ MHz, $F_3 \approx 900$ MHz

It is to be noted that the choice of a large value for $G_1$ results in a decrease of the value of $F_3$. For an optimum result the varous parameters should be such that $F_M$ is as high as possible (when the two stages are coupled).

When the input stage is coupled to the output stage the values of $T_1$, $T_2$ and $T_3$ change slightly and the curve $G(s)$ approximates to an asymptote with a slope of $-18$ dB/octave for frequencies higher than $F_3$. In the above example the frequency $F_M$ for which the input stage has unity gain is substantially higher than 1 GHz. It is to be noted also that near $F_M$ an additional attenuation occurs, because the cut-off frequency $f_T$ is reduced by the arrangement of the transistors in a circuit.

In the central part and below the operating frequency band the feedback of the transistors $T_3$ and $T_4$ has no effect and the gain has a value $G_1$, which is calculated in the same way as for a conventional differential stage.

$G_1 = \dfrac{R_1 I_1}{V_T}$

Figure 4:
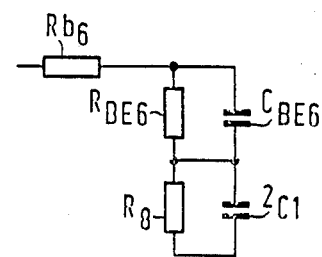
FIG. 4 is an equivalent diagram of the input impedance of the output stage.

The impedance of the second stage as seen from an output of the first stage is schematically represented in FIG. 4. It comprises the intrinsic base resistance $R_{b6}$ of the transistor $T_6$ in series with a part of the base-emitter resistance $R_{BE6}$ of $T_6$ and the resistance of the resistor $R_8$, the base-emitter capacitance $C_{BE6}$ of $T_6$ across $R_{BE6}$ and a capacitor of the value $2C_1$ across $R_4$.

The response curve $G'(s)$ of the second stage may be represented by the formula:

$$G'(s) = \dfrac{G_2(1 + sT_0)}{(1 + sT_4)(1 + sT_5)},$$

where $T_o = 2 R_8 C_1$, so that $$F_0 = \dfrac{1}{4\pi R_8 C_1}$$

and when $R_6 = R_7$ $$G_2 = \dfrac{R_6 I_c}{V_T + R_8 I_2} \approx \dfrac{R_6}{R_8}$$

For example, when $C_1 = 2.5$ pF, $R_6 = 360\,\Omega$ $R_8 = 80\,\Omega$, this yields $G_2 = 4.5$ and $F'_0 \approx 400$ MHz.

However, it is to be noted that the amplifier setting can be optimised only if the two stages are adjusted while coupled to each other, the output stage itself being preferably connected to the circuit which it should drive. Indeed, the input impedance of the output stage, as stated above, has a considerable influence on the high-frequency characteristics of the input stage.

A satisfactory approach to the overall adjustment of the amplifier is to determine first of all the parameters of the input stage as indicated above, to select the desired gain $G_2$ of the output stage by determining a ratio $$\dfrac{R7}{R9} = \dfrac{R6}{R8},$$

to select the frequency $F_o$ near the frequency $F_1$ of the input stage and to vary the values of $R_8 = R_9$ and of $C_1$ whilst maintaining the ratio $$\dfrac{R7}{R9} = \dfrac{R6}{R8}$$

and the product $R_8 C_1$ constant until a maximum frequency corresponding to unity gain (0 dB) is obtained, which means that the two stages are correctly matched to one another.

In a preferred embodiment the amplifier comprises a circuit which introduces a coupling between its output and its input in order to limit the d.c. gain.

Figure 3:
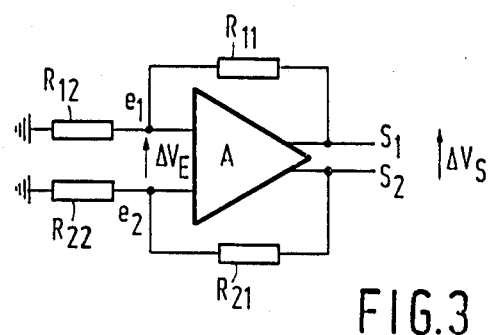
FIG. 3 is an equivalent diagram of the loop which limits the gain of the d.c. component of the signal.
Figure 5:
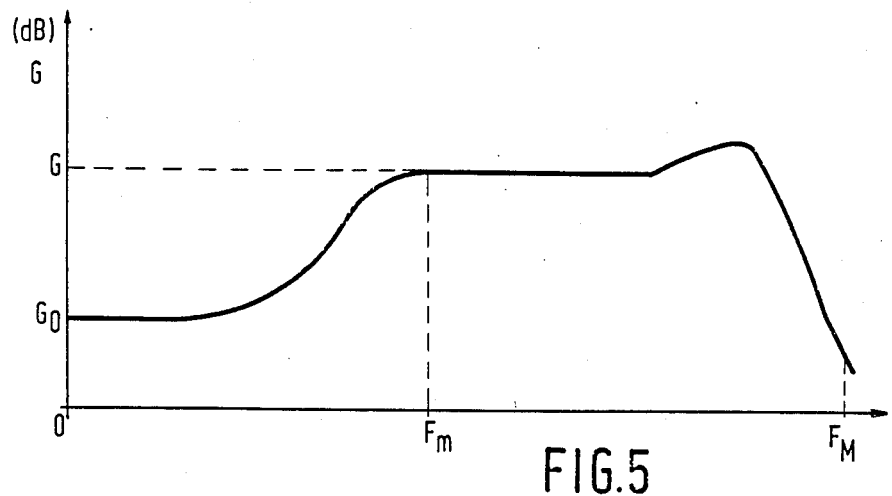
FIG. 5 shows the response curve of the amplifier.

For this purpose the collector of the transistor $T_6$ is connected to earth via a first divider bridge comprising two resistors $R_{11}$ and $R_{12}$, a capacitor $C_2$ being connected across the resistors $R_{12}$ between the center of the divider bridge and earth. The centre of the divider bridge is connected to the base of the transistor $T_1$ via an input resistor $R_{14}$. Similarly, the collector of the transistor $T_7$ is connected to earth via a second divider bridge comprising two resistors $R_{21}$ and $R_{22}$, a capacitor $C_3$ being connected across the resistor $R_{22}$ between the center of the second divider bridge and earth. The center of the divider bridge is connected to the base of the transistor $T_2$ via an input resistor $R_{24}$. $R_{12}$, $R_{13}$, $C_2$ and $C_3$ are selected in such a way that in the operating-frequency band of the amplifier $C_2 = C_3$ act as short-circuits, so that for these frequencies the circuit behaves as though $R_{14}$ and $R_{24}$ were arranged between the base $T_1$ and $T_2$ respectively and earth. Thus $R_{14}$ and $R_{24}$ determine the input impedance of the input stage. For example $R_{14} = R_{24} = 500\,\Omega$. Below a frequency $$F_m = \frac{1}{2\pi R_{12} C_2} = \frac{1}{2\pi R_{22} C_3}$$

the amplifier gain is reduced to a value $G_o$ (see FIG. 5) equal to $$1 + \frac{R_{11}}{R_{12}} = 1 + \frac{R_{21}}{R_{22}}$$

which is the value of the gain obtained for the d.c. component of the signal. In order to obtain a gain smaller than 2 it is required that $R_{11} < R_{12}$. Indeed, for direct current the capacitors $C_2$ and $C_3$ are charged via the resistors $R_{14}$ and $R_{24}$ respectively. The potential across $R_{14}$ is $e_1$ and the potential across $R_{24}$ is $e_2$. As a result of this, the equivalent diagram is as shown in FIG. 3, which shows an amplifier A comprising two inputs $e_1$ and $e_2$ and two outputs $s_1$ and $s_2$, the resistor $R_{12}$ being arranged between $e_1$ and earth, the resistor $R_{22}$ between $e_2$ and earth, the resistor $R_{11}$ between s and e, and the resistor $R_{21}$ between s and $e_2$.

The condition of equilibrum of the currents in each of the branches yields the value of the gain stated above.

For example, for $R_{11} = R_{21} = 5.4$ K$\Omega$, $R_{12} = R_{22} = 7.4$ k$\Omega$, $C_2 = C_3 = 1$ pF, this yields $F_m \simeq 42$ MHz and $G_o = 1.73$ for an overall gain of the amplifier $G = G_1$. $G_2 \simeq 18$, whilst maintaining the values in the above examples.

The output stage can perform a signal-shaping function by clipping the sinewave signals (operation in the saturated mode). In order to achieve this the supply voltage for the output stage should be selected by, for example, selecting the value of the resistor $R_5$ in such a way that for a given gain G input signals $E_1$, $E_2$ of the lowest level anticipated under the operating conditions of the amplifier are clipped.

What is claimed is:

1. A high-frequency amplifier comprising at least one differential stage which comprises a first and a second transistor whose emitters, which are coupled to each other, are connected to a first current source, whose bases receive the input signals, and whose collectors are connected to the emitters of a third transistor and a fourth transistor, respectively, whose collectors are each connected to a supply-voltage source by a first bias resistor and a second bias resistor, respectively, the bases of the third transistor and the fourth transistor being connected to the collectors of the fourth transistor and the third transistor, respectively, said differential stage constituting a differential input stage, further comprising an output stage which comprises a fifth transistor ($T_6$) and a sixth transistor ($T_7$) whose bases are connected to the collectors of the first transistor ($T_1$) and the second transistor ($T_2$), respectively, whose collectors are each connected to said supply-voltage source by a third bias resistor and a fourth bias resistor ($R_6$, $R_7$), and whose emitters are connected to each other by a first capacitor ($C_1$) in parallel with a first resistive divider bridge having first and second elements ($R_8$, $R_9$) whose center is connected to a second current source ($R_{10}$, $T_8$), the elements ($R_8$, $R_9$) of the first resistive divider bridge, the first capacitor ($C_1$) and the bias resistors being chosen to provide for the amplifier an overall gain higher than unity in its operating frequency range.

2. An amplifier as claimed in claim 1, wherein the amplifier also has a gain higher than a given nominal value at its minimum operating frequency.

3. An amplifier as claimed in claim 1 wherein the collectors of the fifth transistor ($T_6$) and the sixth transistor ($T_7$) are each connected to the base of an output transistor ($T_9$, $T_{10}$) arranged as an emitter follower.

4. An amplifier as claimed in claim 1, wherein the gain for the d.c. component of the input signals ($E_1$, $E_2$) is limited, and the amplifier comprises a second resistive divider bridge ($R_{11}$, $R_{12}$) connected between the collector of the fifth transistor ($T_6$) and earth D and has its center decoupled by means of a second capacitor ($C_2$), and connected to the base of the first transistor ($T_1$) via a first input resistor ($R_{14}$), and a third resistive divider bridge ($R_{21}$, $R_{22}$) which is arranged between the collector of the sixth transistor ($T_7$) and earth, and has a center decoupled by means of a third capacitor ($C_3$), and connected to the base of the second transistor ($T_2$) via a second input resistor ($R_{24}$).

5. An amplifier as claimed in claim 1, wherein said gain is set so that for input signals of a level higher than a nominal minimum level, the output stage operates in the saturated mode, whereby sinusoidal input signals yield clipped output signals.

* * * * *